United States Patent
Huang et al.

(10) Patent No.: US 7,225,392 B2
(45) Date of Patent: May 29, 2007

(54) ERROR CORRECTION TRELLIS CODING WITH PERIODICALLY INSERTED KNOWN SYMBOLS

(75) Inventors: Dawei Huang, Brisbane (AU); Feng Qi, Beijing (CN)

(73) Assignee: Lucent Technologies Inc., Murray Hill, NJ (US)

( * ) Notice: Subject to any disclaimer, the term of this patent is extended or adjusted under 35 U.S.C. 154(b) by 447 days.

(21) Appl. No.: 10/090,371

(22) Filed: Mar. 4, 2002

(65) Prior Publication Data

US 2003/0167441 A1    Sep. 4, 2003

(51) Int. Cl.
*H03M 13/03*    (2006.01)

(52) U.S. Cl. ........................ 714/786; 714/794; 714/795

(58) Field of Classification Search ................ 714/786, 714/794, 795; 375/262
See application file for complete search history.

(56) References Cited

U.S. PATENT DOCUMENTS

| | | | |
|---|---|---|---|
| 4,208,739 A | 6/1980 | Lu et al. ........................ 375/2 |
| 4,389,636 A | 6/1983 | Riddle, Jr. ........... 340/347 DD |
| 4,757,506 A | 7/1988 | Heichler ...................... 371/43 |
| 5,257,272 A | 10/1993 | Fredrickson ................. 371/43 |
| 5,430,744 A | 7/1995 | Fettweis et al. .............. 371/43 |
| 5,436,918 A * | 7/1995 | Kato et al. ................... 714/795 |
| 5,488,633 A | 1/1996 | Laroia ......................... 375/262 |
| 5,548,600 A | 8/1996 | Fredrickson et al. .......... 371/43 |
| 5,706,312 A | 1/1998 | Wei ............................. 375/298 |
| 5,931,965 A | 8/1999 | Alamouti ..................... 714/792 |
| 6,081,921 A * | 6/2000 | Simanapalli ................. 714/786 |
| 6,108,374 A | 8/2000 | Balachandran et al. ..... 375/227 |
| 6,170,076 B1 | 1/2001 | Kim ............................. 714/786 |
| 6,215,827 B1 | 4/2001 | Balachandran et al. ..... 375/262 |
| 6,347,122 B1 | 2/2002 | Chen et al. .................. 375/262 |
| 6,397,367 B1 * | 5/2002 | Park et al. ................... 714/786 |
| 6,487,693 B1 * | 11/2002 | Kim et al. ................... 714/786 |
| 6,519,732 B1 * | 2/2003 | Li ............................... 714/755 |
| 2001/0033578 A1 | 10/2001 | Rodriguez et al. .......... 370/442 |

OTHER PUBLICATIONS

Stephen B. Wicker, Error Control Systems for Digital Communication and Storage, Prenitce-Hall, pp. 264-273.*

* cited by examiner

*Primary Examiner*—Joseph D. Torres (57) ABSTRACT

The present invention discloses a system and method for channel coding data within a digital communication system. A data receiving circuit receives a digital input data sequence and periodically inserts known symbols, such as zeros, into the digital input data sequence as part of a convolutional zero code of the present invention. It forms an expanded digital input data sequence. An encoder is operatively connected to the data receiving circuit and trellis encodes the expanded sequence to produce a channel coded data stream such that the number of connections between trellis nodes in a trellis are reduced.

17 Claims, 7 Drawing Sheets

$K = 3, l = 2$ convolutional encoder

FIG. 1

$K = 3, l = 2$ convolutional encoder

FIG. 2

Trellis for ordinary convolutional code

FIG. 3

Inserting zero at the first position periodically

FIG. 4

Insert zero at the second position periodically

FIG. 5

Generator Matrix

Let
$$C^{(j)} = X^{(j)}G, \quad j = 1, 2, \ldots, K-1, \quad (1)$$
where $X^{(j)} = [1, x_1, \ldots, x_{j-1}, 0, x_{j+1}, \ldots]$, $x_{tK+j} = 0, t = 0, 1, \ldots$, $G$ is the Toeplitz block matrix
$$G = [\vec{g}_{i-j}]_{i,j=0,1,\ldots}.$$
with $1 \times K$ sub-blocks
$$\vec{g}_i = \begin{cases} [g_{1,i}, g_{2,i}, \ldots, g_{l,i}], & i = 0, 1, \ldots, m; \\ 0, & \text{others.} \end{cases}$$

FIG. 6

Gj Presentation $$\begin{bmatrix} \vec{g}_0(t) & \vec{g}_1(t+1) & \cdots & \vec{g}_m(t+m) & \cdots \\ 0 & \vec{g}_0(t+1) & \cdots & \vec{g}_{m-1}(t+m) & \cdots \\ \cdot & \cdot & \cdots & \cdot & \cdots \end{bmatrix}$$

FIG. 6A $$\phi_t\left(X_{t-K+2}^t\right)$$
$$= \max_{X_0^{t-K+1}} M(X_0^t)$$
$$= \max_{x_{t-K+1}} \left[ L\left(X_{t-K+1}^t\right) + \phi_{t-1}\left(X_{t-K+1}^{t-1}\right) \right]$$

FIG. 7A

DECODING

Step 1 Initialization: For $0 \leq t < K - 1$, starting from $\phi\left(X_{-K}^{-1}\right) = 0$ we calculate $\phi\left(X_{t-K+1}^{t}\right)$ for all possible combinations of $X_{0}^{t}$ by (3).

30

Step 2 Recursive forward algorithm at $t$:
If $t \neq K - 1 \pmod{K}$, we compute $\phi\left(X_{t-K+2}^{t}\right)$ by (3) and save $$\tilde{x}_{t-K+1}\left(X_{t-K+2}^{t}\right)$$
$$= \arg\max_{x_{t-K+1}} \left[L\left(X_{t-K+1}^{t}\right) + \phi\left(X_{t-K+1}^{t-1}\right)\right]; (5)$$

otherwise we compute $\phi\left(X_{t-K+2}^{t}\right)$ by (4).
Go to Step 3.

32

→ STEP 3

*FIG. 7B*

> Step 3 Recursive backward algorithm at $t$:
> If $t - D \neq K - 1 \pmod{K}$, starting from
> $$\hat{X}^{t}_{t-K+2} = \arg\max_{X^{t}_{t-K+2}} \phi\left(X^{t}_{t-K+2}\right) \quad (6)$$
> we calculate $\hat{x}_k = \tilde{x}_k\left(\hat{X}^{k+K-1}_{k+1}\right)$, $k = t-K+1, t-K, t-K-1, \ldots$ until backward $D$ symbols to find
> $$\hat{x}_{t-D} = \tilde{x}_{t-D}\left(\hat{X}^{t-D+K-1}_{t-D+1}\right); \quad (7)$$
> otherwise $\hat{x}_{t-D} = 0$.

$T \neq N$, Back to Step 2    34

If $t = n$ go to Step 4; otherwise go to Step 2.    36

> Step 4 Termination: Let $n \leq t < n + K - 2 = N$.
> If $t \neq K - 1 \pmod{K}$, we compute $\phi\left(X^{t}_{t-K+2}\right)$ by (3) and save $\tilde{x}_{t-K+1}\left(X^{t}_{t-K+2}\right)$ by (5); otherwise we compute $\phi\left(X^{t}_{t-K+2}\right)$ by (4) and we do not need to save $\tilde{x}_{t-K+1}\left(X^{t}_{t-K+2}\right)$ since it must be zero.
> Repeat this step until $t = N$, then go to Step 5.

To Step 5    38

FIG. 7C

From Step 4

Step 5 Recursive backward algorithm at the end: Starting from $$\hat{x}_n = \arg\max_{x_n} \phi\left(\underbrace{0,...,0}_{K-2}, x_n\right),$$

we estimate $x_t$ by $$\hat{x}_t = \tilde{x}_t\left(\hat{X}_t^{t+K-2}\right), \quad t = n-1, n-2, ..., n-D.$$

FIG. 8

| Code | Conv. Code | Conv. Zero Code |
|---|---|---|
| Code Rate | $\frac{T}{(T+K-1)l} \approx \frac{1}{l}$ | $\frac{T}{Nl} \approx \frac{K-1}{Kl}$ |
| Complexity | $\approx T(l+2)2^K$ | $\approx \frac{K}{K-1}T(l+2)2^{K-1}$ |
| Memory | $2^K D$ | $2^{K-1}\left(D - \left[\frac{D}{K}\right]\right)$ |
| Delay | $D$ | $D$ |

ERROR CORRECTION TRELLIS CODING WITH PERIODICALLY INSERTED KNOWN SYMBOLS

FIELD OF THE INVENTION

This invention relates to channel coding, and more particularly, this invention relates to channel coding and trellis codes.

BACKGROUND OF THE INVENTION

It is well known that digital data transmitted over a communications channels is subject to signal impairments created by noise, distortion and fading, creating transmission errors. These types of errors can also occur when digital data is stored on devices, including magnetic media or solid-state memories that contain imperfections. This noise is critical in wireless communications where the noise can be extensive and the amount of power used in communication is limited. Typically, the noisy channel is characterized by the signal-to-noise ratio (SNR), which is a ratio of the signal energy over the noise energy in decibels. It is also possible to take the difference in transmission rates into account and define the SNR per bit when the efficiency of codes is compared with different code rates.

It is known that introducing a controlled amount of redundancy by coding in a selected message before a transmission over a communications channel corrects possible errors due to noise, as noted by Dr. Claude Shannon. In a noisy channel, the transmission rate is reduced to obtain accuracy. A limit, called the Shannon limit, shows the upper bound of the transmission rate for lossless communications in a noisy channel.

Block codes were first used in communications, but these block codes were not efficient when comparing to the Shannon limit. More efficient channel codes have been developed on the basis of trellis coding. A trellis encoder includes a Finite State Machine (FSM) and typically a signal mapper. The trellis is generated by the FSM, while code words are binary sequences that are one-to-one mappings of all distinct paths on the trellis by the signal mapper. When a special input sequence is transmitted, the path corresponding to this input sequence is found on the trellis, and the code word generated by the signal mapper. On the decoding side, a maximum likelihood (ML) decoder as a Viterbi decoder or a Maximum a Posteriori (MAP) decoder converts the received code words into the input sequence.

One important parameter of the Finite State Machine is the memory length m that decides the trellis. The most widely used trellis codes include convolutional codes and turbo codes, as noted in many teachings, including the IEEE technical paper entitled, "Modulation Encoding For Linear Gaussian Channels," IEEE Transactions on Information Theory, Volume 44, No. 6, October 1998, the disclosure which is hereby incorporated by reference in its entirety.

Other examples of trellis coding, the use of convolutional codes, and convolutional encoders are disclosed in U.S. Pat. Nos. 5,706,312; 6,108,374; 6,215,827 assigned to Lucent Technologies; and 6,347,122 assigned to Agere Systems, the disclosures which are hereby incorporated by reference in their entirety.

As is known to those skilled in the art, trellis coded modulation is a combined method for joint coding and modulation based on the design of convolutional codes. These are matched to a modulation signal, which is established to maximize the Euclidian distance between a modulated sequence. A trellis diagram is a graph that represents the changing time of a Finite State Machine by defining the states as vertices. Any possible state transitions are displayed as edges. As to the various types of codes, a convolutional code is generated by a linear shift-register circuit and performs a convolution operation on an information sequence, while a turbo code is generated by a parallel concatenation of two (or more) simple convolutional encoders that are separated by interleavers. Thus, along the lines of a turbo code, a concatenated code is established cascading two codes separated by an interleaver. In a generator matrix, a K×N matrix produces a code word (of length N) of a block code by multiplying the information block of length K. The hamming distance is the number of places in which two sequences of equal length differ. The minimum distance of a code is the smallest hamming distance between any pair of code words. The weight distribution is a list of the hamming distances of each code word from a given reference code word.

A Viterbi algorithm is an efficient method for decoding convolutional codes based on finding the path on a trellis diagram that is at a minimum distance from a receive sequence. Related to Viterbi coding is Maximum-Likelihood (ML) decoding that maximizes the probability of a receive sequence given any of the possible code words. If code words are equally likely, there could be minimum possible error probability.

A convolutional code has been used in GSM and IS-95 systems. Its signal mapper consists of code word generators that define the addition and multiplication on the finite algebra. It is not efficient in comparison of its results to the Shannon limit. Its efficiency would be increased as the memory m increases. Both the computational complexity and memory storage for the Viterbi decoder will be doubled as m increases one. Thus, this approach is not feasible even for m=20. Turbo code, as noted before, is a further development of the convolutional code using parallel concatenation of two or more of the convolutional encoders and a pseudo-random interleaver. This code system allows a user to transfer the information in a noisy channel almost without distortion by a rate close to the Shannon limit. Unfortunately, it has a longer delay than that delay used with the conventional convolutional code. In any event, both convolutional codes and turbo codes are recommended in the third generation wireless communication systems, similar to UMTS and CDMA 2000.

SUMMARY OF THE INVENTION

The present invention overcomes the disadvantages of the prior art indicated above. In the present invention, known symbols, such as zeros, are inserted into a digital input data sequence to form an expanded digital input data sequence. Ordinary trellis coding methods are then applied to the expanded sequence.

In accordance with one aspect of the present invention, a system for channel coding data within a digital communication system includes a data receiving circuit for receiving a digital input data sequence. This circuit periodically inserts known symbols into the digital input data sequence and forms an expanded digital input data sequence. An encoder is operatively connected to the data receiving circuit for trellis encoding the expanded digital input data sequence and producing a channel coded data stream, such that the number of connections between trellis nodes in a trellis are reduced.

In another aspect of the present invention, the known symbols that are inserted comprise zeros. The inserted zeros form a "zero code" that is similar to an equivalent time variant convolutional code.

In yet another aspect of the present invention, the encoder comprises a convolutional encoder and can generate code words that are one-to-one mappings of the distinct paths on a trellis to binary sequences. The topology of the trellis corresponds to memory length m and the known symbols are inserted after each m symbol within the input data sequence.

In yet another aspect of the present invention, the encoder is operative as a generator matrix having a constraint length K=m-1, wherein m corresponds to the memory length, and the code rate is R=1/l, such that the known symbols are inserted after each K-1 information bit. A maximum likelihood (ML) decoder receives and encodes the channel coded data stream. The maximum likelihood (ML) decoder comprises a Viterbi decoder in yet another aspect of the present invention.

A method of channel coding is also disclosed by receiving a digital input data sequence and periodically inserting known symbols into the digital input data sequence and forming an expanded digital input data sequence. The method further comprises the step of trellis encoding the expanded digital input data sequence to produce a channel coded data stream such that the number of connections between trellis nodes in a trellis are reduced.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously is a novel and unobvious channel coding system and method, cooperating with trellis codes, by periodically inserting known symbols, such as zeros, into the transmitted digital data information sequence. By this method and system, the present invention obtains the following advantages: (i) it reduces the computational complexity by half; (ii) it reduces the required memory storages by half; (iii) it reduces the Bit Error Rate (BER). While the delay in the decoding process remains the same, the code rate is reduced by a fraction of the original. In contrast to existing trellis codes, the present invention simplifies the topology of the trellis, i.e., by reducing the number of connections between the nodes in the trellis.

The following description will progress relative to its implementation on the convolutional code. Naturally, the present invention can be used on many different types of codes as suggested by those skilled in the art. The distance spectrum of a convolutional code can be improved by the present invention. Simulations have shown that the code rate reduction is compensated by improving the error correction capability of the code.

As is known to those skilled in the art, channel coding reduces the Bit Error Rate (BER) by adding redundant bits in the transmitted message. It improves the reception quality by sacrificing the raw data transmission speed. For wireless communications, this is advantageous because limited power is used to transmit information in a noisy channel. It is usually not possible to increase Signal-to-Noise Ratio (SNR)=10 $\log_{10} E_c/2\sigma^2$ higher than certain level, where $E_c$ is the power of the signals while $\sigma^2$ is the variance of noise. On the other hand, if it is possible to work at a low SNR while keeping the same reception quality, then more subscribers are served in a region, provided there is enough bandwidth. The reception quality is measured by Bit Error Rate (BER). Apart from the two properties of (1) BER and (2) the code rate, however, three other properties are also important for wireless communications. These properties are (3) the decoding delay, (4) the computational complexity, and (5) the memory requirement. When designing any mobile communication equipments with limited power and size, all five properties are crucial.

Trellis codes are among the most popular channel codes, and include convolutional codes and turbo codes. Both convolutional and turbo codes have advantages in some of the five areas identified above, but none of them are superior in all five areas. Thus, the development of new channel coding methods that give a good balance among: (1) code rate, (2) BER, (3) delay, (4) computational complexity and (5) memory requirements is difficult.

The present invention is a new channel coding system and method that is operable by periodically inserting known symbols into the transmitted information sequence and then trellis encoding. In one aspect of the present invention, the periodically inserted known symbols are zero symbols, and referred to hereinafter also as the "zero code."

It is well-known by those skilled in the art that the trellis code can be described by a state transfer diagram in a Markov chain (Finite State Machine) and the hamming weights of codewords associated with each transition in the diagram. Efforts have been made to allocate the Hamming weights on the trellis through selecting matrix generators to improve the distance spectrum of the codes. In contrast, by using the inserted known symbols of the present invention, the topology of the trellis is simplified by reducing the number of connections between the trellis nodes. Since both computational complexity and the required memory storages of a Maximum Likelihood (ML) decoder, e.g., the Viterbi decoder, or a Maximum A Posterior (MAP) decoder, depend on the complexity of the trellis, the present invention obtains the benefits on both computation and storage.

As a result of inserting zeros, some paths on the trellis will disappear. It is known that the components of the distance spectrum are obtained by searching all possible paths, which start from and end at the zero state and do not pass the zero state, with a certain Hamming weight of the codewords associated to these paths. Thus, at least inserting zeros will not increase the components in the distance spectrum because of the less possible paths in the trellis. There are significant improvements in the distance spectrum after inserting zeros, and thus, the BER is reduced.

The following description follows the implementation of the present invention on the convolutional code. Naturally, the present invention is not limited to convolutional codes, but can be applied to turbo codes. It is also possible to revive some catastrophic codes into good codes as explained in detail in commonly assigned copending patent application entitled, "SYSTEM AND METHOD FOR REVIVING CATASTROPHIC CODES," filed on the same date, the disclosure which is hereby incorporated by reference in its entirety. The present invention is also operable with a generator matrix such that the zero code of the present invention is equivalent to a special time varying convolutional code. The distance spectrum for some convolutional codes is also improved by the present invention. The corresponding Maximum-Likelihood (ML) decoding algorithm is desired by modifying the Viterbi algorithm.

In trellis coding, different code words are mappings of distinct paths in the trellis through the code generators. To correct possible errors in the received code words, the hamming distances between distinct code words are as large as possible. Usually the optimal encoders are obtained by searching code generators.

Because the code words are associated with the paths in the trellis, they also depend on the topology of the trellis. The topology of a trellis code is simplified dramatically by inserting known symbols, such as zeros, in the present invention. For a convolutional code, the generator matrices for this zero code are found. It will be evident that the relation and difference between the zero code and the time varying code can be substantial.

In a linear code, it is usually assumed that the information sequence is all-zero while the error bit is one. For the zero code, it is usually not possible to know where the error bit is located, but it is possible to know that it cannot be at the position of the inserted zeros. Thus, the present invention considers (K−1) cases corresponding to different positions of the inserted zero against the error bit one, i.e., there are (K−1) trellis diagrams and (K−1) generator matrices for the zero code.

The present invention uses the time invariant convolutional code with the polynomial generators, with the constraint length K=m+1, where m is the memory length, and the code rate is R=1/l. It is possible to assume that $x_t$ is binary and the information sequence shifts one bit per time. If $x^j_k=[x_k, x_{k+1} \ldots, x_j]'$, then the code word $c_t=[c_{t,1}, \ldots, c_{t,l}]$ and can be identified as:

$c_{t,i} = g_i X^t_{t-K+1} (\text{mod} 2), i=1, 2, \ldots, l,$ and $g_i=[g^i,0, g_{i,1}, \ldots, g_{l,m}]$ is the polynomial generator. As usual, it is possible to assume that $x_t=0$ for all $t<0$.

Figure 1:
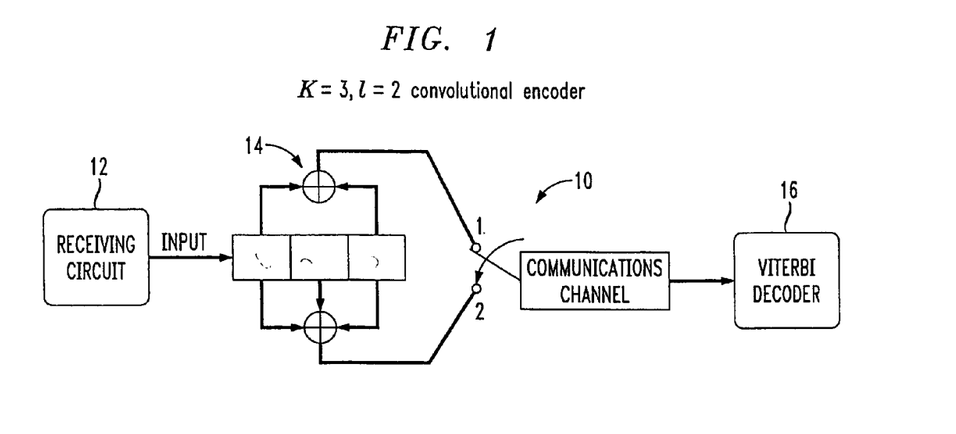
FIG. 1 is a block diagram showing a basic convolutional encoder that is operative with a data receiving circuit and Viterbi decoder.
Figure 2:
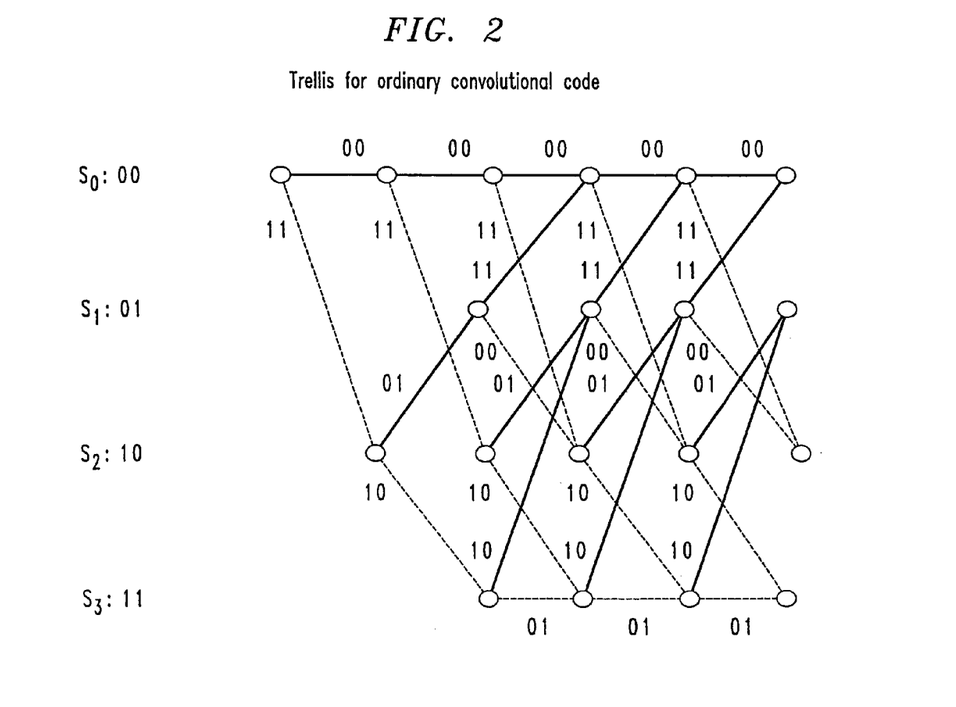
FIG. 2 illustrates a trellis for an ordinary convolutional code.

As an example, the optimal code, in the sense that its minimum free distance is the largest, with K=3 and l=2, is shown in FIG. 1, while its trellis diagram is shown in FIG. 2.

FIG. 1 illustrates the system 10 of channel encoding and decoding that can be used in the present invention where a receiving circuit 12 is illustrated that could be modified to insert known symbols, such as zeros. The encoder 14 is illustrated as a convolutional encoder, but could be other type of encoders as known to those skilled in the art. A Viterbi decoder 16 is illustrated. The present invention uses a convolutional encoder and a receiving circuit. The trellis diagram for a conventional convolutional encoder where K=3 and L=2 is shown in FIG. 2.

The dotted lines are indicative for inputting a one, while a darkened line is indicative for inputting a zero. In general, for a trellis with $2^m$ states, there are $2^{m+1}$ branches between two consecutive layers.

Figure 3:
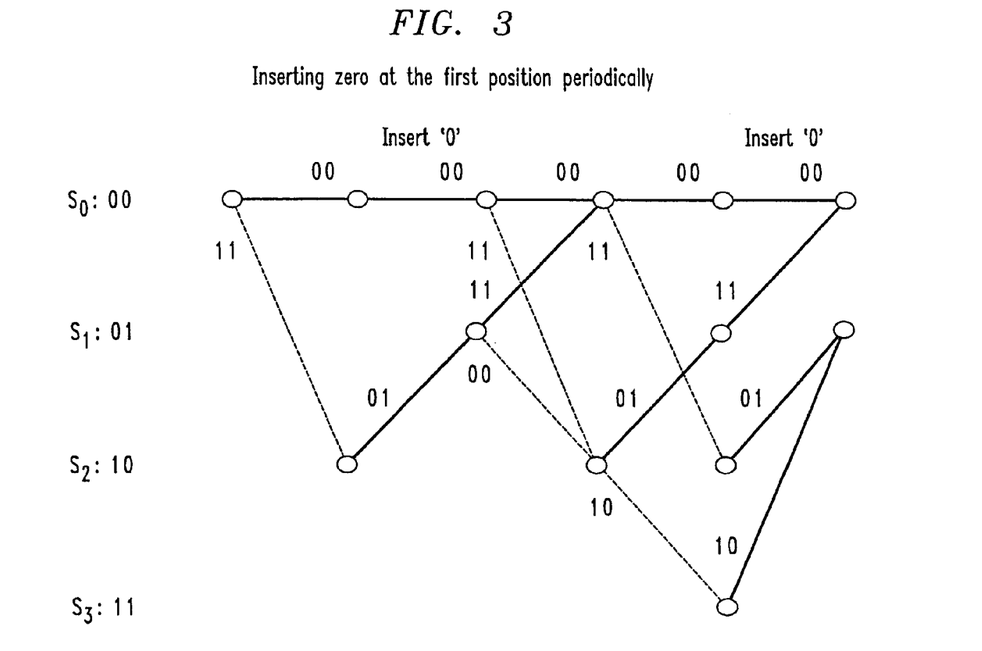
FIG. 3 illustrates a trellis where zeros or other known symbols are inserted at the first position periodically.
Figure 4:
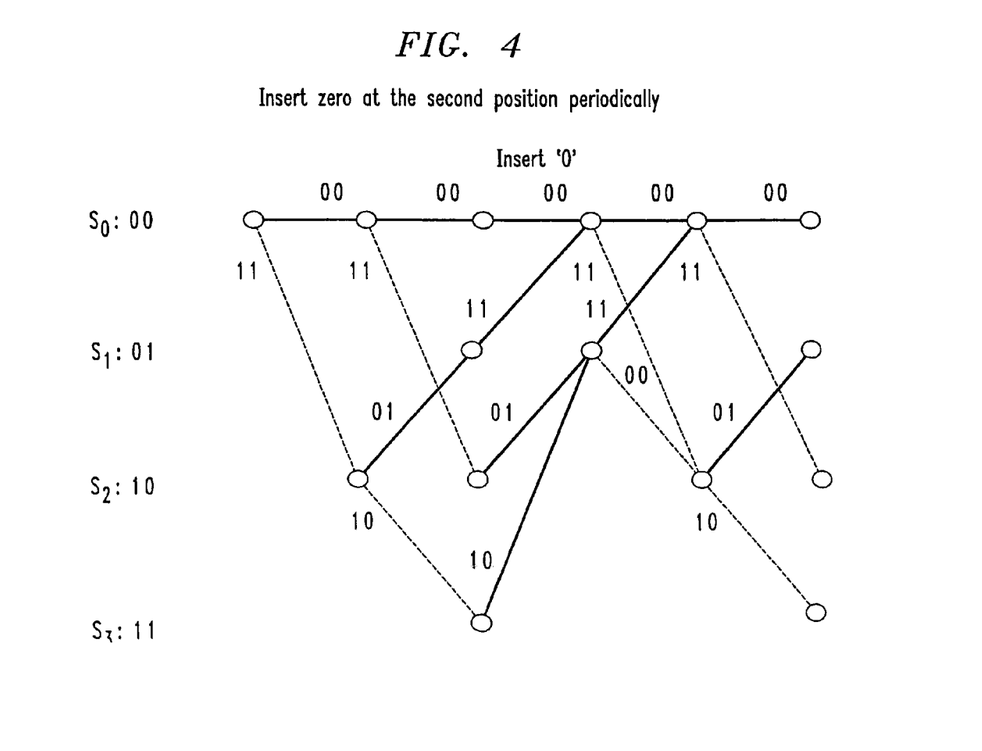
FIG. 4 illustrates a trellis where known symbols, such as zeros, are inserted at the second position periodically.

The present invention inserts one zero after each (K−1) information bits. Since there is always a zero bit in the shift register and its position known, the topology of the convolutional code is changed. Half of the connections between nodes in the trellis are cut off, as shown in the trellis of FIGS. 3 and 4.

In contrast to the original trellis with $2^m$ states, there are $2^{m-1}$ states in most layers because there is always a zero in the shift register and its position known. The only exception is when the inserted zero moves to the end of the register. In any case, there are $2^m$ branches, which are only half of the original, between two consecutive layers after inserting zeros.

Figure 5:
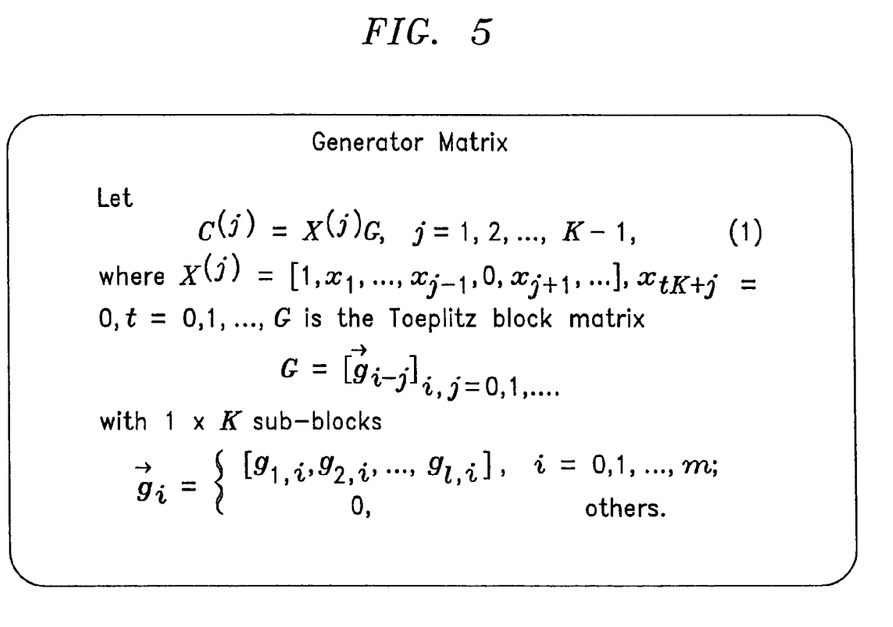
FIG. 5 illustrates in detail the first calculations used in forming a generator matrix of the present invention.

FIG. 5 illustrates the basic aspects for the generator matrix, showing how the final generator matrix $G_j$ is initiated to result in having is own distance spectrum.

Since $x_{tK+j}=0$, I can be the information sequence without inserting zeros, and thus:

$C^{(j)}=IG_j,$ where $G_j$ is obtained from G by deleting all (tK+j)-th rows, t=0, 1, 2, . . . , in G.

Figure 6:
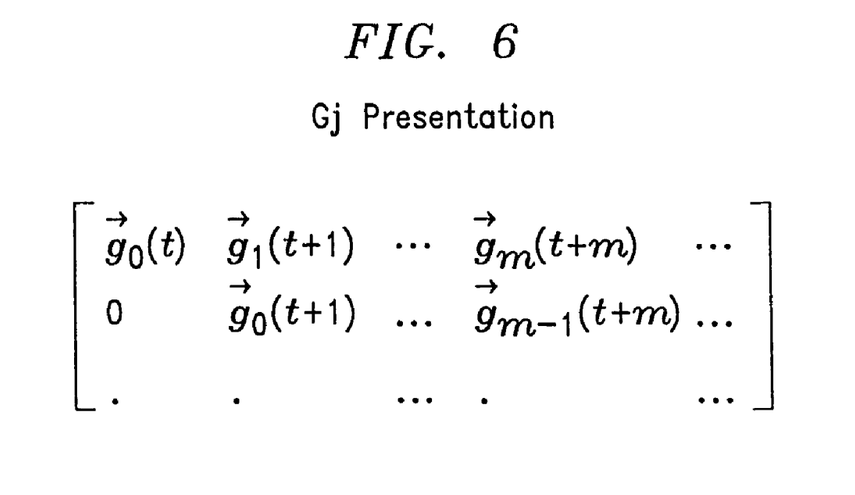
FIG. 6 illustrates a presentation of the generator matrix for a zero code of the present invention, which is similar to a time varying code.

Because $G_j$ is no longer a block Toeplitz matrix, the "zero code" of the present invention is similar to a time varying code. The $G_j$ presentation is shown in the table of FIG. 6, which results because the non-zero sub-block g is not always on the diagonal. Nevertheless, each generator matrix $G_j$ has its own distance spectrum, producing (K−1) distance spectrums for a zero code.

It is also possible to calculate the transfer functions of the convolutional zero codes and compare them to that of the original convolutional code. The results are set forth below.

If T(w) is the transfer function, the ordinary convolutional code with K=3, R=½ and $g_1$=[1, 0, 1], $g_2$=[1, 1, 1] results in:

$$T(w) = \frac{w^5}{1-2w} = w^5 + 2w^6 + \ldots + 2^n w^n + \ldots$$

In contrast, for the corresponding zero code, no matter whether the first zero is inserted at the first or the second position after the first error bit one results in:

$$T(w) = \frac{w^5}{1-w} = w^5 + w^6 + \ldots + w^n + \ldots$$

It is evident that there are improvements on the distance spectrum components at high Hamming distances.

Calculating the transfer function can be difficult for large K. According to the simplified topology of the trellis after periodically inserting zeros, it is possible to calculate the first few components in the distance spectrum for convolutional zero codes. As an example only, some results are listed to show the improvements in the distance spectrum. When K=4, $g_1$=17, $g_2$=13, there is one ordinary spectrum and three zero code spectrums. In the following table, the first row is the hamming distances starting from $d_{free}$, the second row is the corresponding distance spectrum components for the ordinary convolutional code, and the third, fourth and fifth rows are the distance spectrum components for the convolutional code inserting zeros at the first, second and third positions after the first error bit one, respectively.

| 6 | 7 | 8 | 9  | 10 | 11 | 12  | 13  | 14  | 15   |
|---|---|---|----|----|----|-----|-----|-----|------|
| 1 | 3 | 5 | 25 | 25 | 55 | 121 | 267 | 589 | 1299 |
| 0 | 1 | 1 | 3  | 3  | 5  | 8   | 14  | 23  | 39   |
| 1 | 2 | 2 | 7  | 7  | 11 | 19  | 31  | 52  | 85   |
| 1 | 2 | 3 | 8  | 8  | 13 | 21  | 35  | 58  | 97   |

When K=9, $g_1$=751, $g_2$=557, it is possible to have one ordinary spectrum and eight zero code spectrums:

| 12 | 13 | 14 | 15 | 16  | 17  | 18  | 19   | 20   |
|----|----|----|----|-----|-----|-----|------|------|
| 10 | 9  | 30 | 51 | 156 | 340 | 875 | 1951 | 5127 |
| 5  | 4  | 12 | 21 | 42  | 84  | 180 | 406  | 907  |
| 4  | 5  | 11 | 12 | 36  | 76  | 140 | 305  | 765  |
| 6  | 4  | 18 | 18 | 60  | 125 | 241 | 489  | 1216 |
| 6  | 4  | 11 | 17 | 46  | 103 | 211 | 427  | 966  |
| 3  | 8  | 11 | 24 | 53  | 95  | 204 | 478  | 972  |
| 7  | 9  | 14 | 26 | 64  | 129 | 270 | 571  | 1317 |
| 10 | 8  | 8  | 15 | 61  | 122 | 266 | 541  | 1263 |
| 10 | 8  | 17 | 26 | 71  | 142 | 327 | 677  | 1560 |

The present invention also provides a decoding algorithm. The ML Viterbi decoder searches the path with the maximal metric among all possible paths on the trellis. Since inserting zeros simplifies the topology of a trellis code, the benefits in three aspects are obtained: computation, storage and BER.

The system can append m dummy zeros at the end of the information sequence (zero-tail method). It is also possible to adopt a fixed delay, e.g., a delay D=5K, in the Vertibi algorithm. In the algorithn, $$T + \left[\frac{T}{K-1}\right]$$

is the total length after inserting zeros, while [y] denotes the integer part of a real number y. Thus, in accordance with the present invention, $x_t$=0, t=jK−K−1 or t>n (formula 2).

$M(X^t_0)$ is the cumulative metric on the path $X^t_0$ while $L(X^t_{t-K+1})$ is the branch metric associated with the branch $X^t_{t-K+1}$. The searching $\max_{X_o^{T-1}} M(X_o^{T-1})$ over all possible paths $X_o^{T-1}$ can be done by recursive calculating as shown by the algorithm set forth in FIG. 6A (equation 3).

Figure 6A:
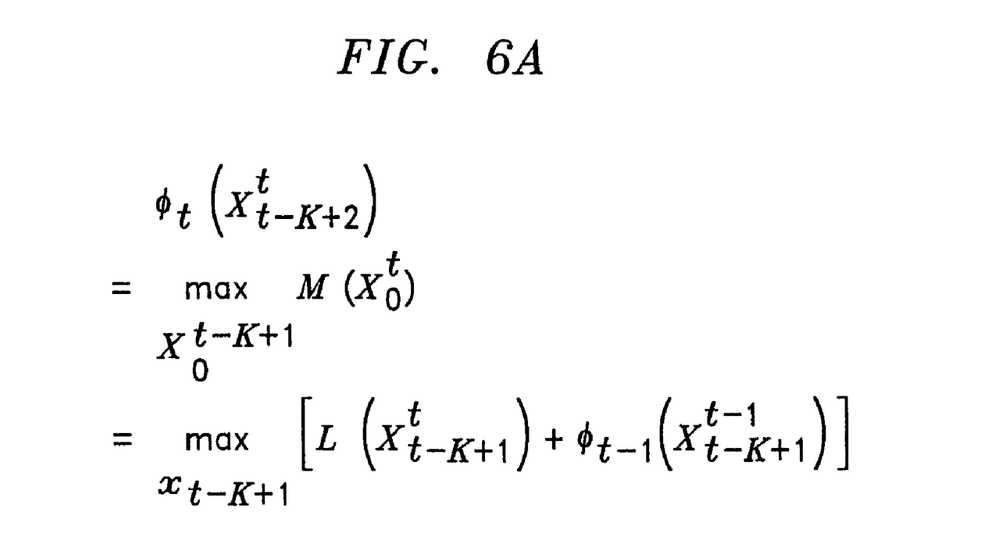
FIG. 6A is a diagram showing first recursive calculations for the decoding algorithm.

It is known, however, that $X_{t-K+1}$=0 is the inserted symbol and can be simplified as a formula 4:

$$\phi_t(X^t_{t-K+2}) = L(X^t_{t-K+2}, 0) + \phi_{t-1}(X^{t-1}_{t-K+2}, 0)$$

Figure 7A:
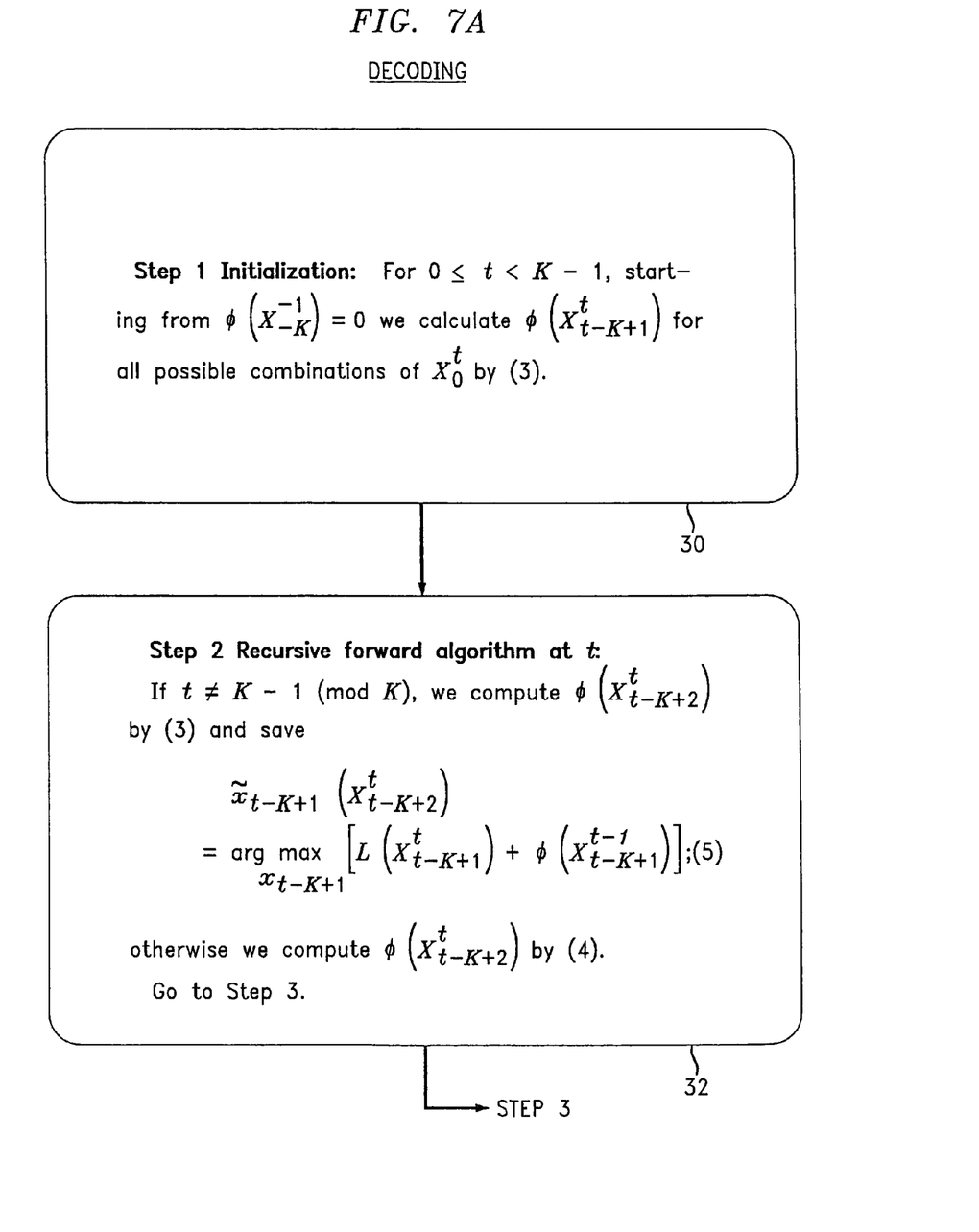
FIGS. 7A, 7B and 7C illustrate basic steps used in the decoding algorithm of the present invention.
Figure 7B:
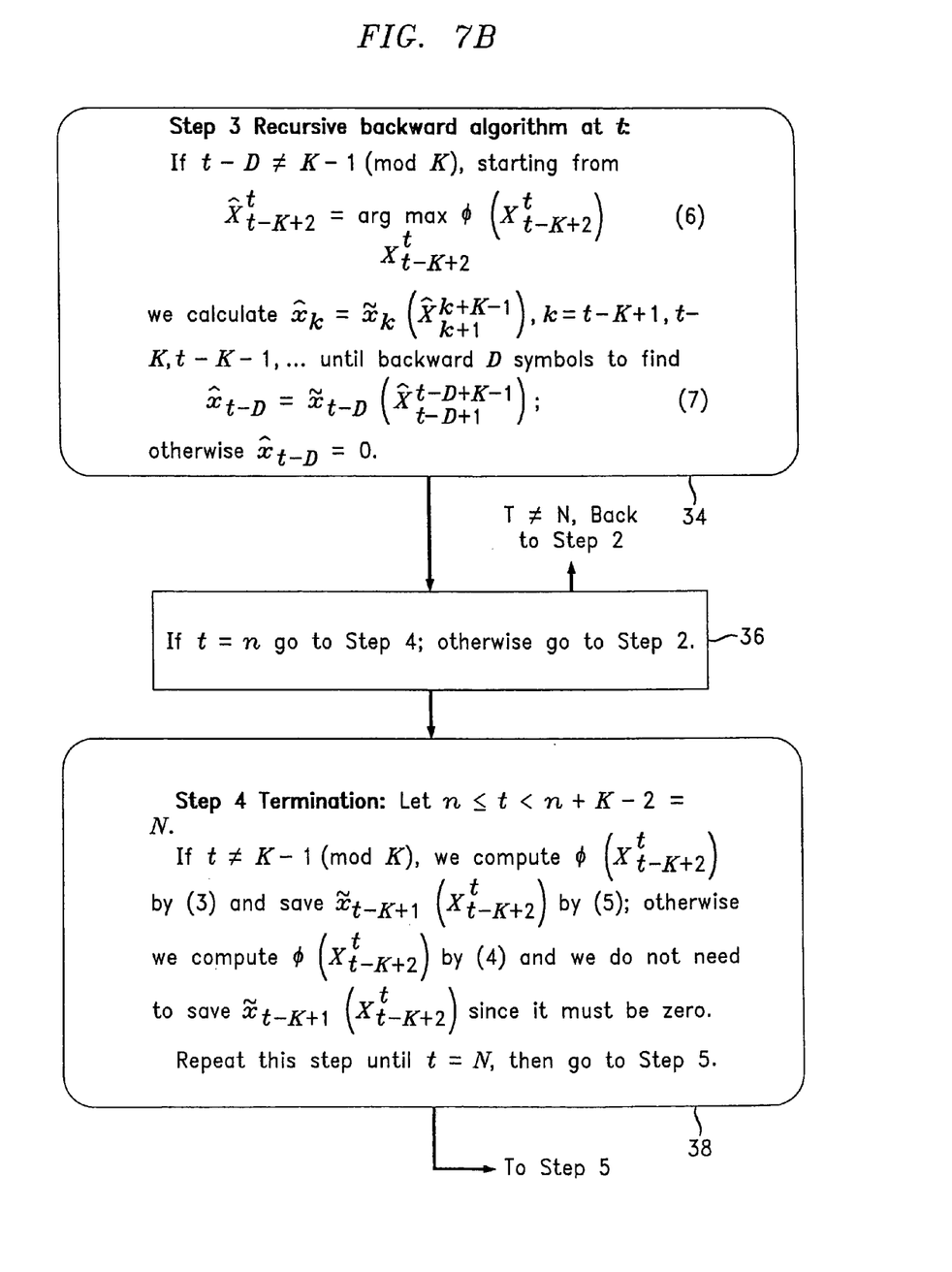
Figure 7C:
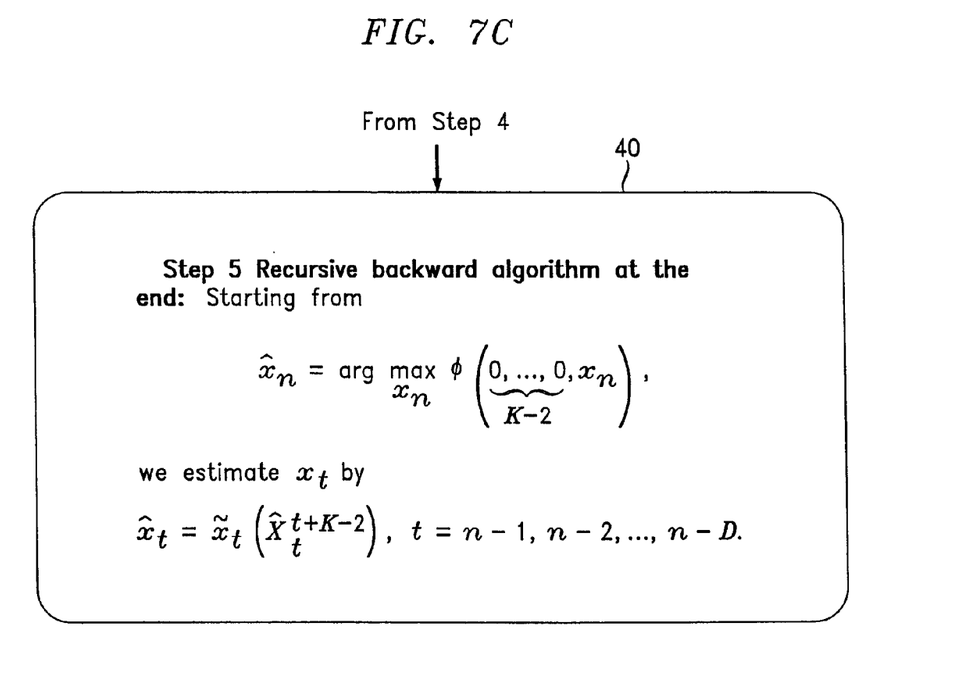

There now follows a flow chart shown in FIGS. 7A–7C, depicting the various steps of the algorithm. For simplicity in the following charts, the subscript t is dropped and $\phi((X^{t+k-1}_{t+1})=\phi_t (X^{t+k-1}_{t+1})$ is used. The five step algorithm as shown in FIGS. 7A–7C is obtained.

In FIGS. 7A through 7C, a step one initialization is shown (block 30). A step two occurs as a recursive forward algorithm at T (block 32). Step 3 (block 34) indicates a recursive backward algorithm at T. If T=N, then the algorithm proceeds or otherwise reverts back to the recursive forward algorithm (block 36). Termination occurs at step four shown (block 38) and at step five, the recursive backward algorithm is at the end (block 40).

Figure 8:
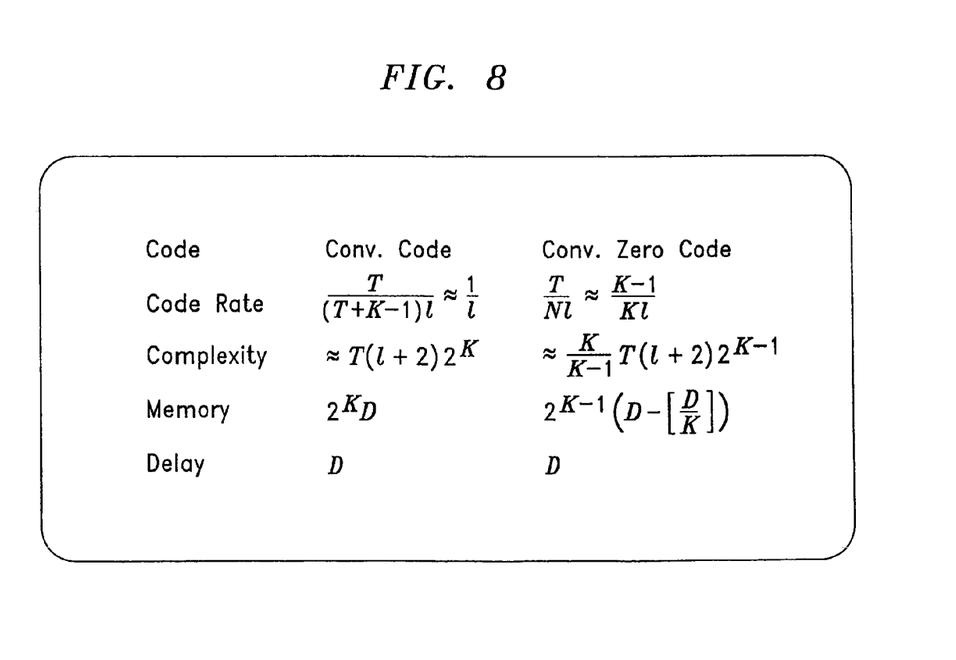
FIG. 8 is a table summarizing properties of the decoding algorithm called the convolutional zero code and comparing it to an ordinary convolutional code.

The properties of the decoding algorithm, i.e., the convolutional "zero code" are compared to an ordinary convolutional code in the table shown in FIG. 8.

Simulations for the Additive White Gaussian Noise (AWGN) channel have been accomplished in accordance with the present invention and two examples are illustrated. One example compares the convolutional zero code to the corresponding convolutional zero code under the same SNR=10 $\log_{10} E_c/2\sigma^2$ and the other compares them under the same SNR per bit defined as $E_b/N_o$ in dB, where $N_o=2\sigma^2$ while $E_b=E_c/R$. The simulation was done for K=9l, $g_1$=753, $g_2$=561 in octal.

| SNR                      | −3    | −2.5 | −2  | −1.5 | −1   |
|--------------------------|-------|------|-----|------|------|
| Conv. (×10$^{-2}$)       | 18.8  | 10.2 | 4.4 | 1.4  | .34  |
| Zero (×10$^{-2}$)        | 7.3   | 3.2  | 1.1 | .33  | .076 |
| SNR                      | −0.5  | 0    |     |      |      |
| Conv. (×10$^{-3}$)       | .68   | .11  |     |      |      |
| Zero (×10$^{-3}$)        | .15   | .025 |     |      |      |
| $E_b/N_0$                | 0     | .5   | 1   | 1.5  | 2    |
| Conv. (×10$^{-2}$)       | 19.0  | 10.3 | 4.5 | 1.5  | .35  |
| Zero (×10$^{-2}$)        | 13.9  | 7.8  | 3.3 | 1.3  | .32  |
| $E_b/N_0$                | 2.5   | 3    | 3.5 | 4    | 4.5  |
| Conv. (×10$^{-3}$)       | .70   | .12  |     |      |      |
| Zero (×10$^{-3}$)        | .93   | .15  |     |      |      |

The first table illustrates that under the same channels, the zero code is superior than the ordinary code. It confirms the improvements in the distance spectrum. The improvement is obtained in the cost of a lower code rate. From the second table, the change in the code rate is taken into account and the zero code is superior at low SNR per bit. The zero code and its corresponding convolutional code usually have the same $d_{free}$, but fewer components for high hamming weights. The code rate reduction is compensated by the gain in BER.

It is evident that the present invention is an advantageous improvement for trellis coding by periodically inserting known symbols, such as zeros, into the information sequence. This method simplifies the topology of the trellis by reducing the connections between the nodes. Applying it to the convolutional code, it is possible to improve the distance spectrum. While sacrificing the code rate by a fraction, the present invention obtains benefits in computational complexity, storage and BER.

This application is related to copending patent applications entitled, "SYSTEM AND METHOD FOR REVIVING CATASTROPHIC CODES," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

The invention claimed is:

1. A system for channel coding data within a digital communications system comprising:
   a data receiving circuit for receiving a digital input data sequence and periodically inserting known symbols into the digital input data sequence and forming an expanded digital input data sequence based on a constraint length; and
   an encoder operatively connected to said data receiving circuit for trellis encoding the expanded digital input data sequence to produce a channel coded data stream such that the number of connections between trellis nodes in a trellis are reduced, said encoder operative according to the constraint length, and wherein the topology of the trellis corresponds to memory length m, and the known symbols are inserted after each m symbols within the input data sequence.

2. A system according to claim 1, wherein the known symbols that are inserted comprise zeros.

3. A system according to claim 1, wherein said encoder comprises a convolutional encoder.

4. A system according to claim 1, wherein the encoder applies code words that are one-to-one mappings of the distinct paths on a trellis to binary sequences.

5. A system according to claim 1, and further comprising a Maximum Likelihood (ML) decoder for receiving and decoding the channel coded data stream.

6. A system according to claim 5, wherein the Maximum Likelihood (ML) decoder comprises a Viterbi decoder.

7. A system for channel coding data within a digital communications system comprising:
   a data receiving circuit for receiving a digital input data sequence and periodically inserting known symbols into the digital input data sequence and forming an expanded digital input data sequence based on a constraint length; and
   an encoder operatively connected to said data receiving circuit for trellis encoding the expanded digital input data sequence to produce a channel coded data stream such that the number of connections between trellis nodes in a trellis are reduced, said encoder operative according to the constraint length, wherein the encoder is operative as a generator matrix having a constraint length k=m−1, wherein m corresponds to the memory length, and the code rate is R=1/1 such that the known symbols are inserted after each k−1 information bit.

8. A method of channel coding data in a digital communications system comprising the steps of:
   receiving a digital input data sequence;
   periodically inserting known symbols into the digital input data sequence and forming an expanded digital input data sequence based on a constraint length; and
   trellis encoding the expanded digital input data sequence based on the constraint length to produce a channel coded data stream such that the number of connections between trellis nodes in a trellis are reduced, wherein the topology of the trellis corresponds to the memory length m, and further comprising the step of inserting a known symbol after each m symbols within the input data sequence.

9. A method according to claim 8, wherein the step of inserting known symbols comprises the step of inserting zeros into the digital input data sequence.

10. A method according to claim 8, and further comprising the step of applying code words that are one-to-one mappings of the distinct paths on a trellis to binary sequences.

11. A method according to claim 8, and further comprising the step of decoding channel coded data stream within a maximum likelihood (ML) decoder.

12. A method according to claim 11, and further comprising the step of decoding the channel coded data stream within a Viterbi decoder.

13. A method of channel coding data in a digital communications system comprising the steps of:
   receiving a digital input data sequence;
   periodically inserting known symbols into the digital input data sequence and forming an expanded digital input data sequence based on a constraint length k=m−1, wherein m corresponds to a memory length and a code rate is R=1/1, such that the known symbols are inserted after each k−1 information bit; and
   trellis encoding the expanded digital input data sequence to produce a channel coded data stream, wherein the number of connections between trellis nodes in a trellis are reduced.

14. A method according to claim 13, wherein the step of inserting known symbols comprises the step of inserting zeros into the digital input data sequence.

15. A method according to claim 13, and further comprising the step of applying code words that are one-to-one mappings of the distinct paths on a trellis to binary sequences.

16. A method according to claim 13, and further comprising the step of decoding channel coded data stream within a maximum likelihood (ML) decoder.

17. A method according to claim 16, and further comprising the step of decoding the channel coded data stream within a Viterbi decoder.

* * * * *